United States Patent
Datta et al.

(10) Patent No.: US 9,800,207 B2
(45) Date of Patent: Oct. 24, 2017

(54) DOHERTY POWER AMPLIFIER COMBINER WITH TUNABLE IMPEDANCE TERMINATION CIRCUIT

(71) Applicant: SKYWORKS SOLUTIONS, INC., Woburn, MA (US)

(72) Inventors: Kunal Datta, Los Angeles, CA (US); Reza Kasnavi, Solana Beach, CA (US); Aleksey A. Lyalin, Moorpark, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 11 days.

(21) Appl. No.: 14/824,856

(22) Filed: Aug. 12, 2015

(65) Prior Publication Data

US 2016/0049910 A1   Feb. 18, 2016

Related U.S. Application Data

(60) Provisional application No. 62/036,854, filed on Aug. 13, 2014.

(51) Int. Cl.
*H03H 7/38* (2006.01)
*H03F 1/02* (2006.01)
(Continued)

(52) U.S. Cl.
CPC .......... *H03F 1/0288* (2013.01); *H03F 1/565* (2013.01); *H03F 3/19* (2013.01); *H03F 3/245* (2013.01);
(Continued)

(58) Field of Classification Search
CPC .......... H03F 1/0288; H03F 1/565; H03F 3/19; H03F 3/245; H03F 3/72; H03F 2200/111; H03F 2200/451; H03F 2203/7209
(Continued)

(56) References Cited

U.S. PATENT DOCUMENTS 6,320,462 B1   11/2001   Alley
7,362,170 B2   4/2008   Louis
(Continued)

FOREIGN PATENT DOCUMENTS

KR   1020050031663 A   4/2005

OTHER PUBLICATIONS

International Search Report and Written Opinion for PCT/US2015/040098 dated Nov. 24, 2015.
(Continued)

*Primary Examiner* — Robert Pascal
*Assistant Examiner* — Kimberly Glenn
(74) *Attorney, Agent, or Firm* — Chang & Hale LLP

(57) ABSTRACT

Doherty power amplifier combiner with tunable impedance termination circuit. A signal combiner can include a balun transformer circuit having a first coil and a second coil. The first coil can be implemented between a first port and a second port. The second coil can be implemented between a third port and a fourth port. The first port and the third port can be coupled by a first capacitor. The second port and fourth port can be coupled by a second capacitor. The first port can be configured to receive a first signal. The fourth port can be configured to receive a second signal. The second port can be configured to yield a combination of the first signal and the second signal. The signal combiner can include a termination circuit that couples the third port to a ground. The termination circuit can include a tunable impedance circuit.

19 Claims, 7 Drawing Sheets

(51) Int. Cl.
*H03F 3/19* (2006.01)
*H03F 1/56* (2006.01)
*H03F 3/24* (2006.01)
*H03F 3/72* (2006.01)

(52) U.S. Cl.
CPC .......... *H03F 3/72* (2013.01); *H03F 2200/111* (2013.01); *H03F 2200/451* (2013.01); *H03F 2203/7209* (2013.01)

(58) Field of Classification Search
USPC .......................................................... 333/124
See application file for complete search history.

(56) References Cited

U.S. PATENT DOCUMENTS

| | | |
|---|---|---|
| 7,773,959 B1 | 8/2010 | Bachhuber |
| 8,340,606 B2 | 12/2012 | Park |
| 8,593,219 B1 | 11/2013 | Root |
| 8,837,629 B2 | 9/2014 | Ghannouchi |
| 8,928,404 B2 | 1/2015 | Khanifar |
| 9,083,284 B2 | 7/2015 | Maslennikov |
| 9,225,291 B2 | 12/2015 | Ahmed |
| 9,331,638 B2 | 5/2016 | Chen et al. |
| 9,450,541 B2 | 9/2016 | Beltran Lizarraga et al. |
| 9,467,115 B2 | 10/2016 | Lyalin |
| 2002/0102971 A1 | 8/2002 | Jayaraman |
| 2002/0186079 A1 | 12/2002 | Kobayashi |
| 2003/0080827 A1* | 5/2003 | Chominski .............. H03H 7/52 333/119 |
| 2003/0201833 A1 | 10/2003 | Pengelly et al. |
| 2003/0210096 A1 | 11/2003 | Pengelly et al. |
| 2004/0145416 A1 | 7/2004 | Kwon |
| 2009/0212850 A1 | 8/2009 | Aipperspach et al. |
| 2009/0278599 A1 | 11/2009 | Pengelly |
| 2010/0026387 A1 | 2/2010 | Blednov |
| 2011/0080215 A1 | 4/2011 | Meng |
| 2011/0158081 A1 | 6/2011 | Wang et al. |
| 2011/0182319 A1 | 7/2011 | Hua |
| 2011/0279178 A1 | 11/2011 | Outaleb et al. |
| 2012/0105147 A1* | 5/2012 | Harris ...................... H03F 1/56 330/57 |
| 2012/0231753 A1 | 9/2012 | Maslennikov |
| 2012/0235734 A1 | 9/2012 | Pengelly |
| 2012/0235749 A1 | 9/2012 | Aoki |
| 2013/0027272 A1 | 1/2013 | Karthaus |
| 2013/0040586 A1 | 2/2013 | Oliaei et al. |
| 2013/0093534 A1 | 4/2013 | Mei |
| 2013/0154729 A1 | 6/2013 | Folkmann |
| 2013/0181773 A1 | 7/2013 | Liu |
| 2014/0070883 A1 | 3/2014 | Gurvich |
| 2014/0077874 A1 | 3/2014 | Ahmed |
| 2014/0155003 A1* | 6/2014 | Nakatani .................. H03H 7/21 455/90.2 |
| 2014/0375389 A1* | 12/2014 | Jeon ...................... H03F 1/0288 330/295 |
| 2015/0002227 A1 | 1/2015 | Pribble |
| 2015/0091653 A1 | 4/2015 | Kobayashi et al. |
| 2016/0118944 A1 | 4/2016 | Datta et al. |
| 2016/0218682 A1 | 7/2016 | Lyalin |
| 2017/0026002 A1 | 1/2017 | Lyalin |
| 2017/0040953 A1 | 2/2017 | Beltran Lizarraga et al. |

OTHER PUBLICATIONS

Press Release 2013, "Sumitomo Electric Develops High-Efficiency Broadband Power Amplifier Compliant with Next Generation Mobile Communication Standards," Sumitomo Electric Industries, Ltd., Feb. 4, 2013.

* cited by examiner ates DOHERTY POWER AMPLIFIER COMBINER WITH TUNABLE IMPEDANCE TERMINATION CIRCUIT

CROSS-REFERENCE TO RELATED APPLICATION(S)

This application claims priority to U.S. Provisional Application No. 62/036,854 filed Aug. 13, 2014, entitled TUNABLE WIDE-BAND HYBRID-BASED DOHERTY COMBINER WITH WIDE-BAND HARMONIC REJECTION, the disclosure of which is hereby expressly incorporated by reference herein in its entirety.

BACKGROUND

Field

The present disclosure generally relates to radio-frequency (RF) signal combiners.

Description of the Related Art

Multi-mode/multi-band (MMMB) power amplifier modules (PAMs) useful for 4G LTE (Long Term Evolution) applications preferably operate in back-off to satisfy high peak-to-average-power ratio (PAPR) specifications while maintaining high power-added efficiency (PAE). Compared to envelope tracking PAMs for efficiency enhancement under back-off, Doherty PAMs are capable of meeting high efficiency with high linearity under back-off with much reduced system complexity and reduced calibration and digital pre-distortion (DPD) specifications. However, typical Doherty power amplifier architectures are bandwidth limited due to the narrowband nature of existing Doherty power combiners.

SUMMARY

In accordance with some implementations, the present disclosure relates to a signal combiner including a balun transformer circuit having a first coil and a second coil. The first coil is implemented between a first port and a second port. The second coil is implemented between a third port and a fourth port. The first port and the third port are coupled by a first capacitor. The second port and the fourth port are coupled by a second capacitor. The first port is configured to receive a first signal. The fourth port is configured to receive a second signal. The second port is configured to yield a combination of the first signal and the second signal. The signal combiner further includes a termination circuit that couples the third port to a ground. The termination circuit includes a tunable impedance element.

In some embodiments, the signal combiner can further include a controller configured receive a band select signal and to tune the tunable impedance circuit based on the band select signal. In some embodiments, the controller can be further configured to tune at least one of the first capacitor or the second capacitor.

In some embodiments, the first port can be configured to receive a carrier-amplified signal from a Doherty power amplifier (PA) and the fourth port can be configured to receive a peaking-amplified signal from the Doherty PA. In some embodiments, the tunable impedance circuit includes a plurality of capacitors. Each one of the plurality of capacitors can have a capacitance approximately equal to a multiplicative inverse of two times pi times a respective operating frequency of the Doherty PA times a characteristic impedance of a load coupled to the Doherty PA. In some embodiments, the signal combiner can include a controller configured to receive a band select signal indicative of an operating frequency and to tune the tunable impedance circuit to have a capacitance approximately equal to a multiplicative inverse of two times pi times the operating frequency times a characteristic impedance of a load coupled to the Doherty PA. In some embodiments, the controller can be further configured to tune the first capacitor and the second capacitor to have a capacitance approximately equal to half the capacitance of the tunable impedance circuit.

In some embodiments, the first port can be configured to receive a peaking-amplified signal from a Doherty power amplifier (PA) and the fourth port can be configured to receive a carrier-amplified signal from the Doherty PA. In some embodiments, the tunable impedance circuit can include a plurality of inductors. Each one of the plurality of inductors can have an inductance approximately equal to a characteristic impedance of a load coupled to the Doherty PA divided by two times pi times a respective operating frequency of the Doherty PA. In some embodiments, the signal combiner can include a controller configured to receive a band select signal indicative of an operating frequency and to tune the tunable impedance circuit to have an inductance approximately equal to a characteristic impedance of a load coupled to the Doherty PA divided by two times pi times the operating frequency.

In some embodiments, the tunable impedance matching circuit can include a plurality of impedance elements connected in parallel, each one of the plurality of impedance elements including an impedance and a switch connected in series.

In some embodiments, the termination circuit can further include a harmonic rejection circuit configured to reduce the strength of one or more harmonics at the second port. In some embodiments, the harmonic rejection circuit can include a plurality of resonant elements connected in series, each one of the plurality of resonant elements including an inductor and a capacitor connected in parallel. In some embodiments, each one of the plurality of resonant elements can have a resonant frequency approximately equal to a multiple of an operating frequency of the signal combiner. In some embodiments, each one of the plurality of resonant elements can have a resonant frequency approximately equal to twice a respective operating frequency of the signal combiner. In some embodiments, the harmonic rejection circuit is implemented between the third port and the tunable impedance circuit.

In some implementations, the present disclosure relates to a power amplifier module including a packaging substrate configured to receive a plurality of components. The power amplification module includes a signal combiner implemented on the packaging substrate. The signal combiner includes a balun transformer circuit having a first coil and a second coil. The first coil is implemented between a first port and a second port. The second coil is implemented between a third port and a fourth port. The first port and the third port are coupled by a first capacitor. The second port and the fourth port coupled by a second capacitor. The first port is configured to receive a first signal. The fourth port is configured to receive a second signal. The second port is configured to yield a combination of the first signal and the second signal. The signal combiner further includes a termination circuit that couples the third port to a ground. The termination circuit includes a tunable impedance circuit.

In some embodiments, the PA module can further include a controller implemented on the packaging substrate, the controller configured to receive a band select signal and tune the tunable impedance circuit based on the band select signal.

In some implementations, the present disclosure relates to a wireless device including a transceiver configured to generate a radio-frequency (RF) signal. The wireless device includes a power amplifier (PA) module in communication with the transceiver. The PA module includes an input circuit configured to receive the RF signal and split the RF signal into a first portion and a second portion. The PA module further includes a Doherty PA having a carrier amplification path coupled to the input circuit to receive the first portion and a peaking amplification path coupled to the input circuit to receive the second portion. The PA module further includes an output circuit coupled to the Doherty amplifier circuit. The output circuit includes a balun transformer circuit having a first coil and a second coil. The first coil is implemented between a first port and a second port. The second coil is implemented between a third port and a fourth port. The first port and the third port are coupled by a first capacitor. The second port and the fourth port are coupled by a second capacitor. The first port is configured to receive a first signal via the carrier amplification path. The fourth port is configured to receive a second signal via the peaking amplification path. The second port is configured to yield a combination of the first signal and the second signal as an amplified RF signal. The PA module further includes a termination circuit that couples the third port to a ground. The termination circuit includes a tunable impedance circuit. The wireless device further includes an antenna in communication with the PA module. The antenna is configured to facilitate transmission of the amplified RF signal.

In some embodiments, the wireless device can further include a controller configured to receive a band select signal and to tune the tunable impedance circuit based on the band select signal.

The present disclosure relates to U.S. patent application Ser. No. 14/797,261, entitled CIRCUITS, DEVICES AND METHODS RELATED TO COMBINERS FOR DOHERTY POWER AMPLIFIERS, filed on Jul. 13, 2015, and hereby incorporated by reference herein in its entirety.

DETAILED DESCRIPTION OF SOME EMBODIMENTS

The headings provided herein, if any, are for convenience only and do not necessarily affect the scope or meaning of the claimed invention.

Described herein are circuits, systems, and methods for addressing the issue of maintaining high PAE under linearity requirements of 4G LTE standards for a MMMB PAM by proposing a wideband tunable hybrid based combiner for a Doherty power amplifier architecture. Load modulation using Doherty power amplifier is another method of maintaining high efficiency under power back-off. In this approach, two parallel PAMs are used, a carrier amplifier and a peaking amplifier. The peaking amplifier modulates the load seen by the carrier amplifier and thus allows the carrier amplifier to remain in high efficiency, saturated operation even at back-off. This load modulation can be achieved using impedance matching networks having an impedance matched to a specific frequency. Thus for a MMMB PAM without a tunable impedance circuit, several Doherty PAMs (each of which requires two amplifiers) can be used to cover several bands, which may make implementation costly and/or impractical.

Figure 1:
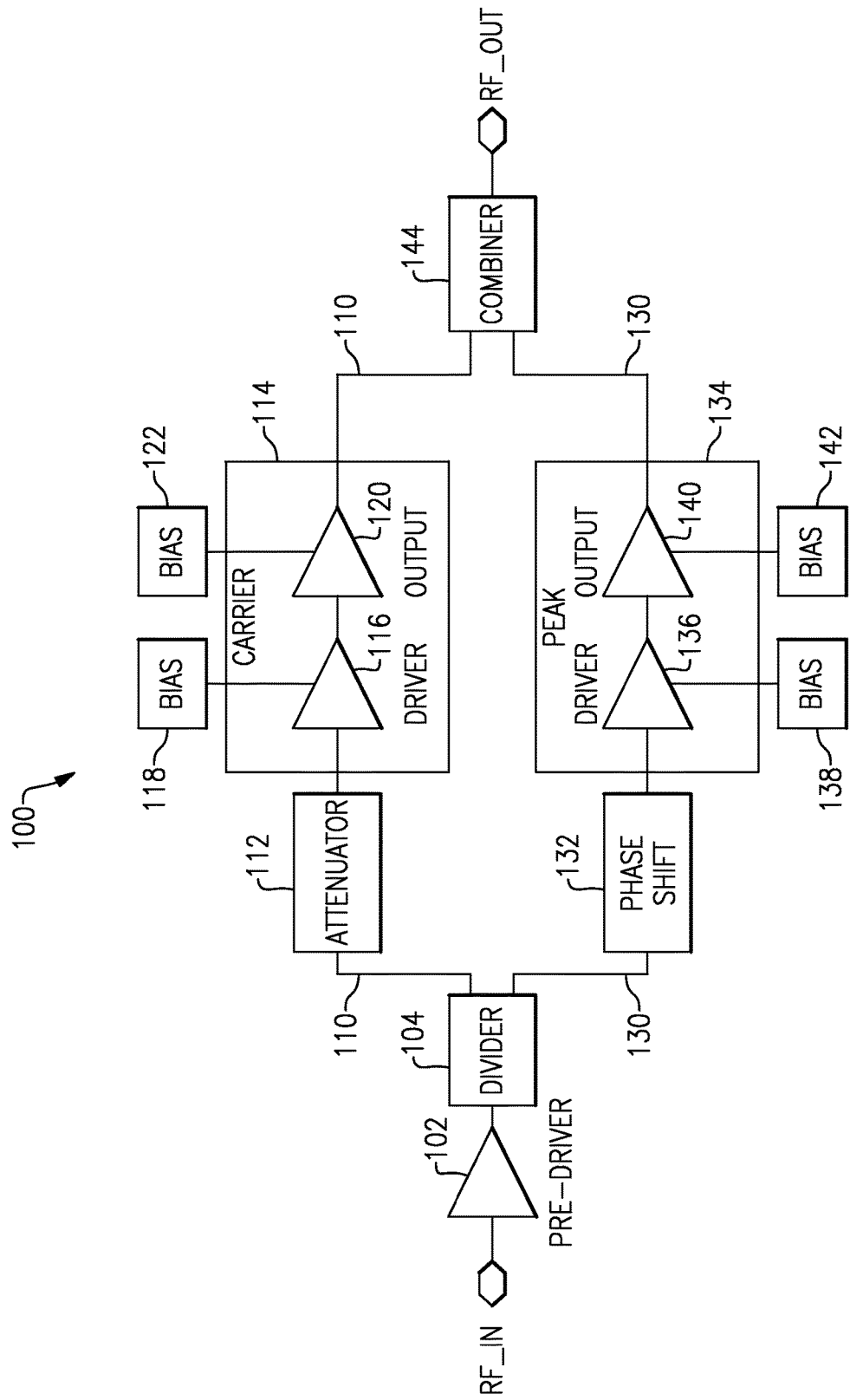
FIG. 1 shows an example architecture of a power amplifier (PA) in which a Doherty combiner having one or more features as described herein can be implemented.

FIG. 1 shows an example architecture of a power amplifier (PA) 100 in which a Doherty combiner having one or more features as described herein can be implemented. The architecture shown is a Doherty PA architecture. Although the various examples are described in the context of such a Doherty PA architecture, it will be understood that one or more features of the present disclosure can also be implemented in other types of PA systems.

The example PA 100 is shown to include an input port (RF_IN) for receiving an RF signal to be amplified. Such an input RF signal can be partially amplified by a pre-driver amplifier 102 before being divided into a carrier amplification path 110 and a peaking amplification path 130. Such a division can be achieved by a divider 104.

In FIG. 1, the carrier amplification path 110 is shown to include an attenuator 112 and amplification stages collectively indicated as 114. The amplification stages 114 are shown to include a driver stage 116 and an output stage 120. The driver stage 116 is shown to be biased by a bias circuit 118, and the output stage 120 is shown to be biased by a bias circuit 122. In some embodiments, there may be more or fewer amplification stages. In various examples described herein, the amplification stages 114 are sometimes described as an amplifier; however, it will be understood that such an amplifier can include one or more stages.

In FIG. 1, the peaking amplification path 130 is shown to include phase shifting circuit 132 and amplification stages collectively indicated as 134. The amplification stages 134 are shown to include a driver stage 136 and an output stage 140. The driver stage 136 is shown to be biased by a bias circuit 138, and the output stage 140 is shown to be biased by a bias circuit 142. In some embodiments, there may be more or fewer amplification stages. In various examples described herein, the amplification stages 134 are sometimes described as an amplifier; however, it will be understood that such an amplifier can include one or more stages.

FIG. 1 further shows that the carrier amplification path 110 and the peaking amplification path 130 can be combined by a combiner 144 so as to yield an amplified RF signal at an output port (RF_OUT). Examples related to the combiner 144 are described herein in greater detail. For example, the combiner 144 may be implemented as one of the combiners of FIG. 3, 4, 5, or 7.

Figure 2A:
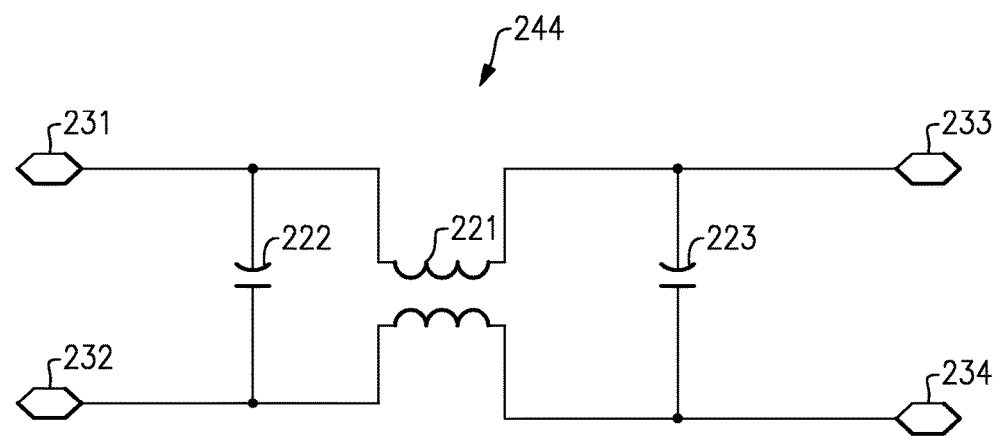
FIG. 2A and FIG. 2B show an example of a hybrid circuit that can be utilized as a Doherty combiner.
Figure 2B:
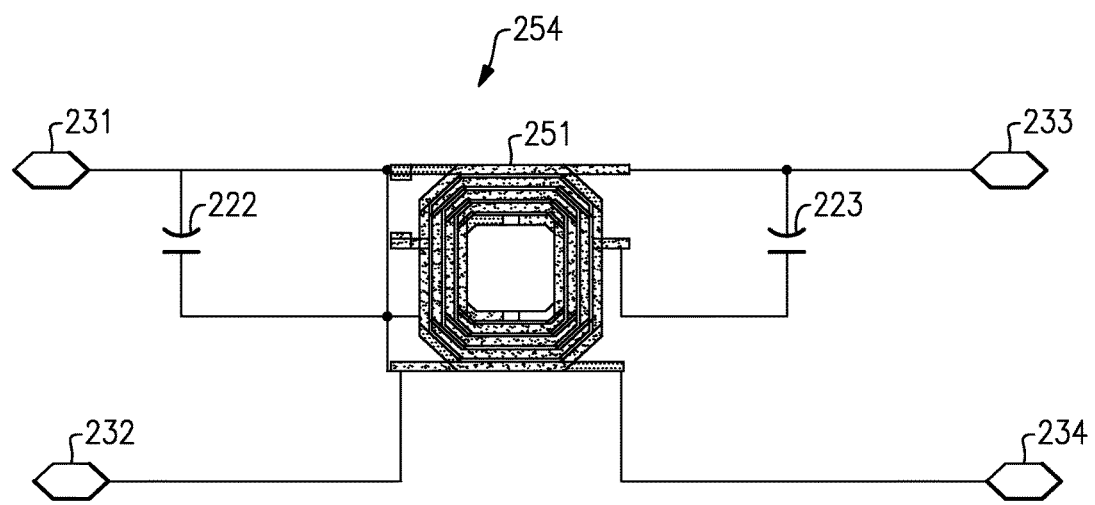

FIG. 2A and FIG. 2B show an example of a hybrid circuit that can be utilized as a Doherty combiner. Such a hybrid circuit can be configured to be particularly suitable for applications such as RFIC (radio-frequency integrated circuit), MMIC (monolithic microwave integrated circuit), and other RF modules. FIG. 2A shows a schematic representation of such a hybrid circuit, and FIG. 2B shows an example layout of the same.

The hybrid circuit of FIG. 2A and FIG. 2B can be implemented as a semi-lumped 90-degree hybrid based on balun. Due to the compact nature of the balun used, such a design can be easily implemented on insulating/semi-insulating substrates such as silicon, GaAs and IPD (integrated passive device) substrates (e.g., glass or silicon).

Thus, in FIG. 2A, a signal combiner 244 is shown including a first port 231, a second port 232, a third port 233, and fourth port 234. A first capacitor 222 couples the first port 231 and the second port 232. A second capacitor 223 couples the third port 233 and the fourth port 234. The signal combiner 244 also includes a transformer 221 with four ports respectively coupled to the four ports 231-234 of the signal combiner 244. In FIG. 2B, a substantially similar signal combiner 254 is illustrated including a balun transformer 251 including a first coil and a second coil.

In the example of FIG. 2A and FIG. 2B, a specific termination can be provided at the isolation port (e.g., the third port 231) to achieve Doherty action. Examples of termination are described herein in greater detail.

In some embodiments, it can be shown that such a specific termination can be implemented as a capacitance (e.g., capacitor) whose reactance is equal in magnitude to characteristic impedance of the system. Accordingly, such a capacitance can be expressed as $C=1/(2 \pi f Z_0)$, where f is the operating frequency of the Doherty PA and $Z_0$ is a characteristic impedance of a load coupled to the Doherty PA.

Figure 3:
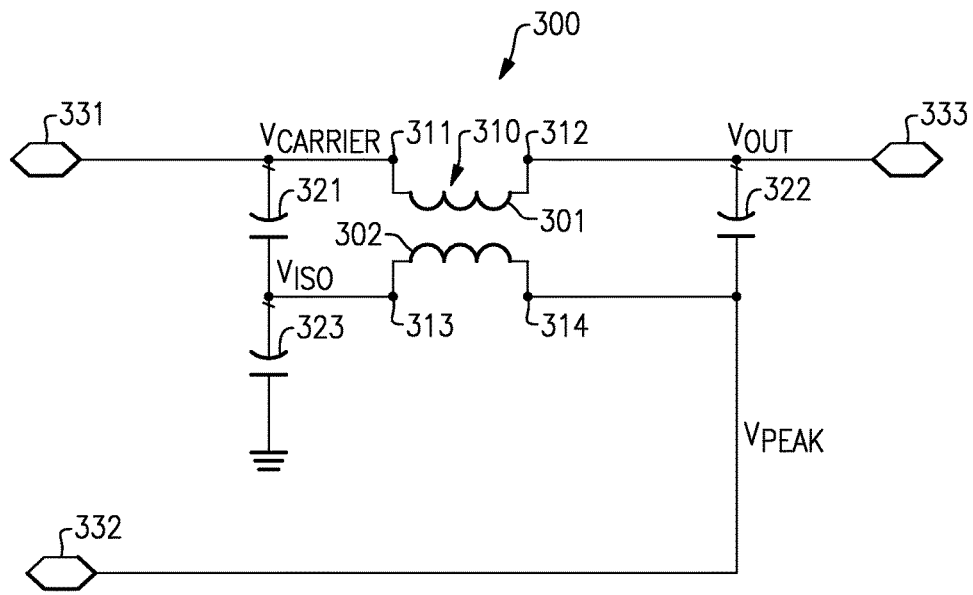
FIG. 3 shows that, in some embodiments, a signal combiner includes a termination circuit including a capacitor.

FIG. 3 shows that, in some embodiments, a signal combiner 300 includes a termination circuit including a capacitor 323. The signal combiner 300 includes a first input port 331 which can be configured to receive a carrier-amplified signal of a Doherty PA, a second input port 332 which can be configured to receive a peaking-amplified signal of a Doherty PA, and an output port 333 which outputs a combination of the signals received at the first input port 331 and the second input port 432. The signal combiner 300 includes a transformer (e.g., a balun transformer) having a first coil 301 and a second coil 302, the first coil 301 implemented between a first port 311 and a second port 312, the second coil 302 implemented between a third port 313 and a fourth port 314. The first port 311 and the third port 313 are coupled by a first capacitor 321 and the second port 312 and the fourth port 314 are coupled by a second capacitor 322. The third port 313 is coupled to ground via a termination circuit which, in FIG. 3, includes a third capacitor 323. In some implementations, the capacitance of the first capacitor 321 and the second capacitor 322 are equal. In some implementations, the capacitance of the third capacitor 323 is twice the capacitance of the first capacitor 321 and/or the second capacitor 322.

In some implementations, the capacitance of the third capacitor 323 is approximately equal to a multiplicative inverse of two times pi times an operating frequency of the Doherty PA times a characteristic impedance of a load coupled to the Doherty PA, e.g., $C=1/(2 \pi f Z_0)$, where f is the operating frequency of the Doherty PA and $Z_0$ is a characteristic impedance of a load coupled to the Doherty PA.

It can be shown that an alternative configuration with an inductive termination of $L=Z_0/(2 \pi f)$ can provide Doherty combiner functionality in a similar manner. Port positions of carrier and peaking amplifier can be swapped in this case.

Figure 4:
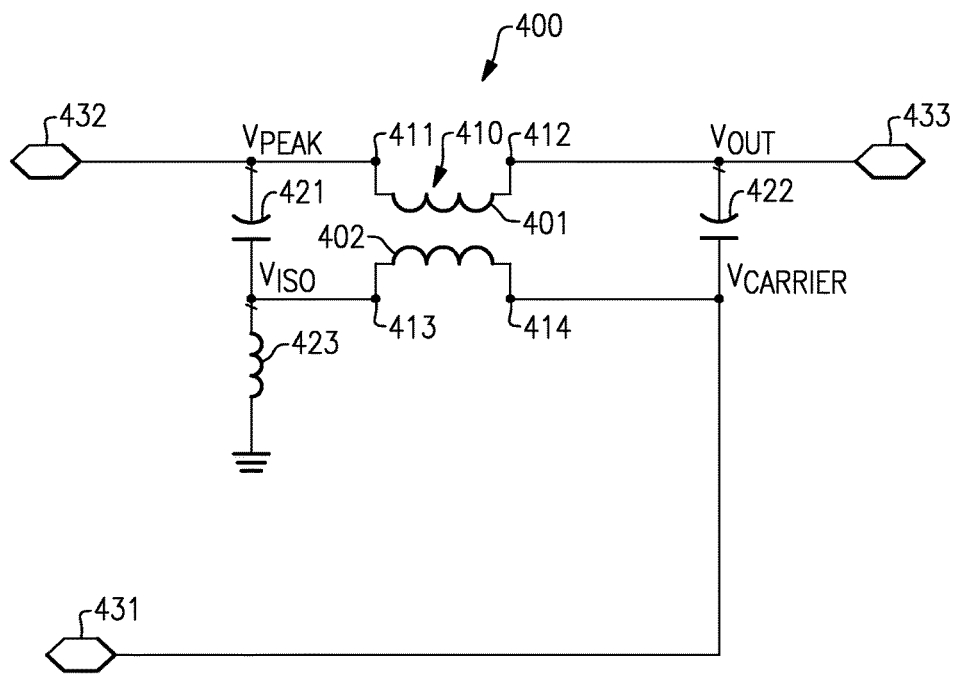
FIG. 4 shows that, in some embodiments, a signal combiner includes a termination circuit including an inductor.

FIG. 4 shows that, in some embodiments, a signal combiner 400 includes a termination circuit including an inductor 423. The signal combiner 400 of FIG. 4 includes a first input port 431 which can be configured to receive a carrier-amplified signal of a Doherty PA, a second input port 432 which can be configured to receive a peaking-amplified signal of a Doherty PA, and an output port 433 which outputs a combination of the signals received at the first input port 431 and the second input port 432. The signal combiner 400 includes a transformer (e.g., a balun transformer) having a first coil 401 and a second coil 402, the first coil 401 implemented between a first port 411 and a second port 412, the second coil 402 implemented between a third port 413 and a fourth port 414. The first port 411 and the third port 413 are coupled by a first capacitor 421 and the second port 412 and the fourth port 414 are coupled by a second capacitor 422. The third port 413 is coupled to ground via a termination circuit which, in FIG. 4, includes an inductor 423.

In some implementations, the inductance of the inductor 423 is approximately equal to a characteristic impedance of a load coupled to the Doherty PA divided by two times pi times an operating frequency of the Doherty PA, e.g., multiplicative inverse of two times pi times an operating frequency of the Doherty PA times a characteristic impedance of a load coupled to the Doherty PA, e.g., $L=Z_0/(2 \pi f)$, where f is the operating frequency of the Doherty PA and $Z_0$ is a characteristic impedance of a load coupled to the Doherty PA.

A signal combiner may be used for multiple modes or multiple operating frequencies as part of a multi-mode/multi-band (MMMB) power amplifier module (PAM). Thus, in some implementations, rather than a single capacitor or single inductor (as shown in FIG. 3 and FIG. 4), a tunable impedance circuit can be used and tuned to various impedances for various frequencies and/or configurations.

Figure 5:
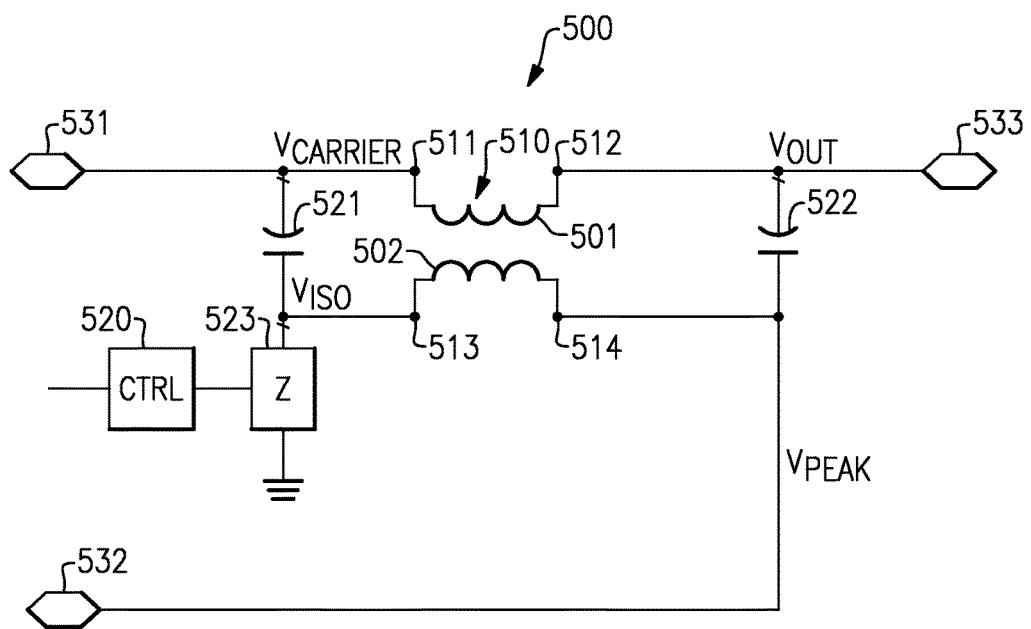
FIG. 5 shows that, in some embodiments, a signal combiner includes a termination circuit including a tunable impedance circuit.

FIG. 5 shows that, in some embodiments, a signal combiner 500 includes a termination circuit including a tunable impedance circuit 523. The signal combiner 500 of FIG. 5 includes a first input port 531 which can be configured to receive a carrier-amplified signal of a Doherty PA (or, in an alternate implementation, a peaking-amplified signal of a Doherty PA), a second input port 532 which can be configured to receive a peaking-amplified signal of a Doherty PA (or, in the alternate implementation, the carrier-amplified signal of a Doherty PA), and an output port 533 which outputs a combination of the signals received at the first input port 531 and the second input port 532. The signal combiner 500 includes a transformer (e.g., a balun transformer) having a first coil 501 and a second coil 502, the first coil 501 implemented between a first port 511 and a second port 512, the second coil 502 implemented between a third port 513 and a fourth port 514. The first port 511 and the third port 513 are coupled by a first capacitor 521 and the second port 512 and the fourth port 514 are coupled by a second capacitor 522. The third port 513 is coupled to ground via a termination circuit which, in FIG. 5, includes a tunable impedance circuit 523.

The signal combiner 500 is controlled by a controller 520 configured to receive a band select signal indicative of a current operating frequency of the system of which the signal combiner 500 is a part. The controller 520 is further configured to tune the tunable impedance circuit 523 based on the band select signal. In some implementations, the controller 520 is further configured to tune at least one of the first capacitor 521 or the second capacitor 522.

In some implementations, the first port 511 is configured to receive a carrier-amplified signal from a Doherty PA (e.g., via the first input port 531) and the fourth port 514 is configured to receive a peaking-amplified signal from the Doherty PA (e.g., via the second input port 532). Thus, the controller 520 can be configured to tune the tunable impedance circuit 523 to have a capacitance approximately equal to a multiplicative inverse of two times pi times the operating frequency (as indicated by the band select signal) times a characteristic impedance of a load coupled to the Doherty PA. The controller 520 can further tune the first capacitor 521 and/or the second capacitor 522 to have a capacitance approximately equal to half the capacitance of the tunable impedance circuit 523.

In some implementations, the first port 511 is configured to receive a peaking-amplified signal from a Doherty PA (e.g., via the first input port 531) and the fourth port 514 is configured to receive a carrier-amplified signal from the Doherty PA (e.g., via the second input port 532). Thus, the controller 520 can be configured to tune the tunable impedance circuit 523 to have an inductance approximately equal to a characteristic impedance of a load coupled to the Doherty PA divided by two times pi times the operating frequency (as indicated by the band select signal).

Figure 6:
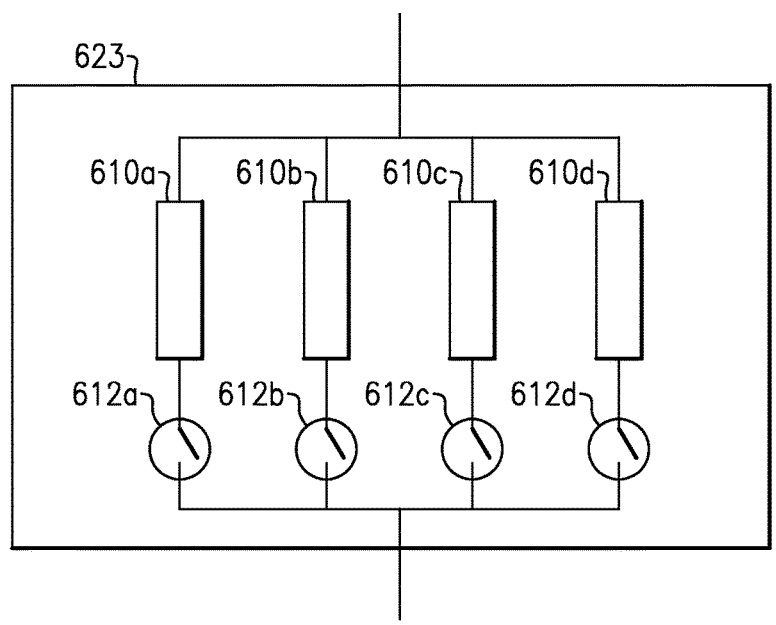
FIG. 6 shows that, in some embodiments, a tunable impedance circuit can include a plurality of impedance elements connected in parallel.

FIG. 6 shows that, in some embodiments, a tunable impedance circuit 623 can include a plurality of impedance elements connected in parallel. Each one of the impedance elements connected in parallel includes an impedance 610a-610d and a switch 612a-612d connected in series. The impedances 610a-610d can include one or more resistors, capacitors, and/or inductors. The switches 612a-612d can be controlled by a controller (e.g., the controller 520 of FIG. 5) into an open state or a closed state to tune the tunable impedance circuit 623 to have a particular impedance.

In some implementations, the tunable impedance circuit 623 is part of a system including a Doherty PA configured to operate at one or more operating frequencies. Thus, the impedances 610a-610d can include a plurality of capacitors, each one of the plurality of capacitors having a capacitance approximately equal to a multiplicative inverse of two times pi times a respective operating frequency of a Doherty PA times a characteristic impedance of a load coupled to the Doherty PA. The impedances 610a-610d can alternatively (or additionally) include a plurality of inductors, each one of the plurality of inductors having an inductance approximately equal to a characteristic impedance of a load coupled to the Doherty PA divided by two times pi times a respective operating frequency of the Doherty PA.

Figure 7:
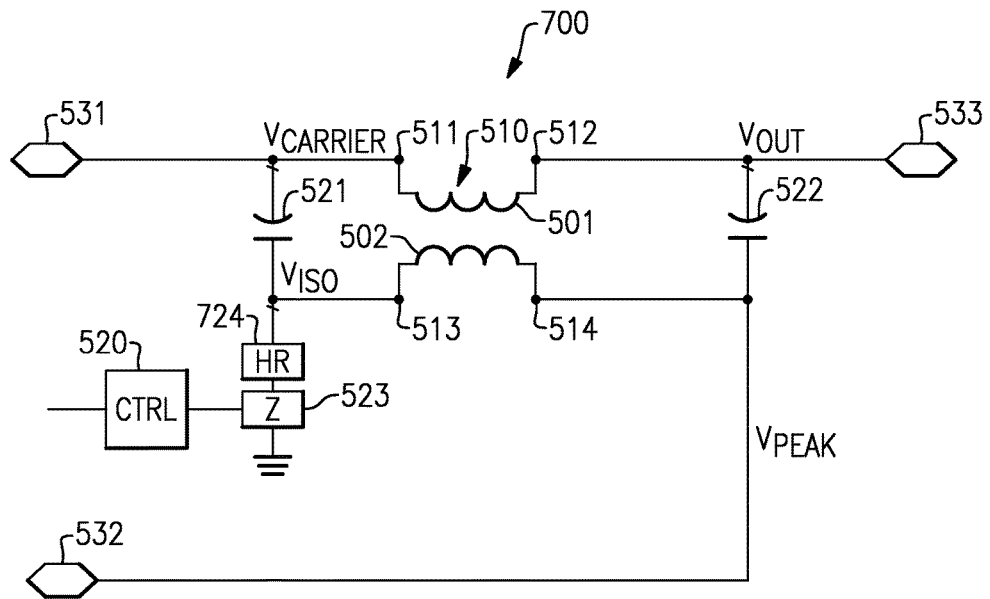
FIG. 7 shows that, in some embodiments, a signal combiner includes a termination circuit including a harmonic rejection circuit.

FIG. 7 shows that, in some embodiments, a signal combiner 700 includes a termination circuit including a harmonic rejection circuit 724. The signal combiner 700 of FIG. 7 is substantially similar to the signal combiner 500 of FIG. 5, except the signal combiner 700 of FIG. 7 includes a harmonic rejection circuit 724 implemented between the third port 513 and the tunable impedance circuit 523.

The harmonic rejection circuit 724 is configured to reduce the strength of one or more harmonics at the second port 512 (and, consequently the output port 533). When the first input port 531 is configured to receive a carrier-amplified signal and the second input port 532 is configured to receive a peaking-amplified signal, the carrier-amplified signal and the peaking-amplified signal may include unwanted harmonics of the RF signal that is being amplified. The harmonic rejection circuit 724 is configured to reduce the strength of these harmonics at the output port 533.

Figure 8:
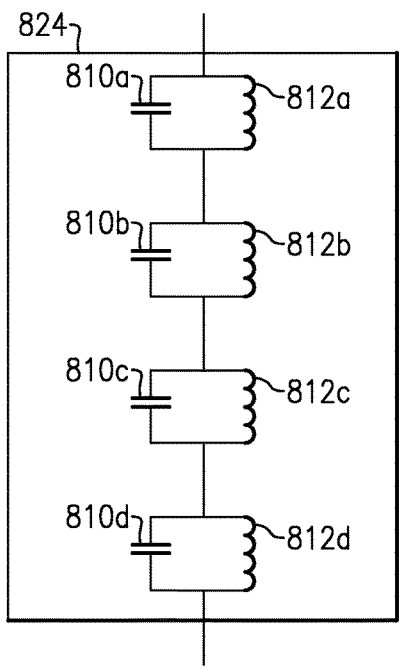
FIG. 8 shows that, in some implementations, a harmonic rejection circuit can include a plurality of resonant elements connected in series.

FIG. 8 shows that, in some implementations, a harmonic rejection circuit 823 can include a plurality of resonant elements connected in series. Each one of the resonant elements includes an inductor 812a-812d and a capacitor 810a-810d connected in parallel. Each one of the plurality of resonant elements can have a resonant frequency approximately equal to a multiple of an operating frequency (one of a set of operating frequencies) of the system of which the harmonic rejection circuit 823 is a part. For example, in some implementations, each one of the plurality of resonant elements has a resonant frequency approximately equal to twice a respective operating frequency of the signal combiner. Thus, if the system including the harmonic rejection circuit 823 is configured to operate at one or more of a first frequency, second frequency, and third frequency, the resonant elements may have respective resonant frequencies of twice the first frequency, twice the second frequency, and twice the third frequency.

Figure 9:
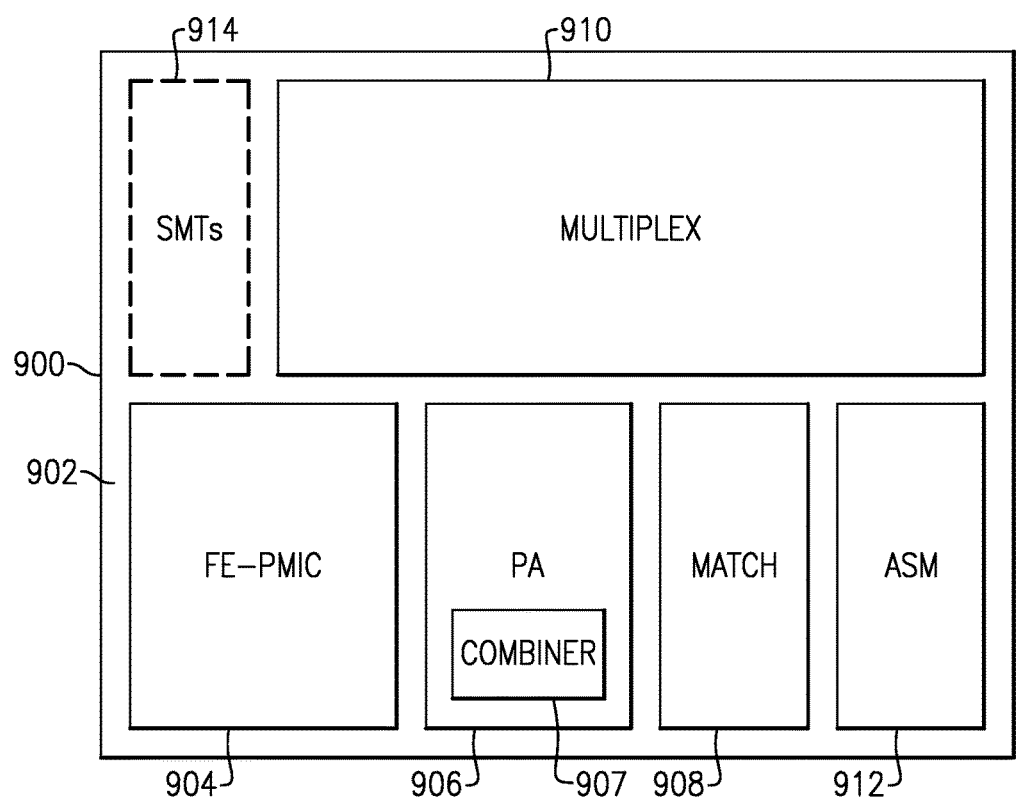
FIG. 9 depicts a module having one or more features as described herein.

FIG. 9 shows that in some embodiments, some or all of the configurations (e.g., those shown in FIGS. 1, 2A, 2B, and 3-8) can be implemented, wholly or partially, in a module. Such a module can be, for example, a front-end module (FEM). In the example of FIG. 9, a module 900 can include a packaging substrate 902, and a number of components can be mounted on such a packaging substrate 902. For example, an FE-PMIC component 904, a power amplifier assembly 906 (which can include a combiner 907 including a tunable impedance circuit), a match component 908, and a multiplexer assembly 910 can be mounted and/or implemented on and/or within the packaging substrate 902. Other components such as a number of SMT devices 914 and an antenna switch module (ASM) 912 can also be mounted on the packaging substrate 902. Although all of the various components are depicted as being laid out on the packaging substrate 902, it will be understood that some component(s) can be implemented over other component(s).

In some implementations, a device and/or a circuit having one or more features described herein can be included in an RF electronic device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Figure 10:
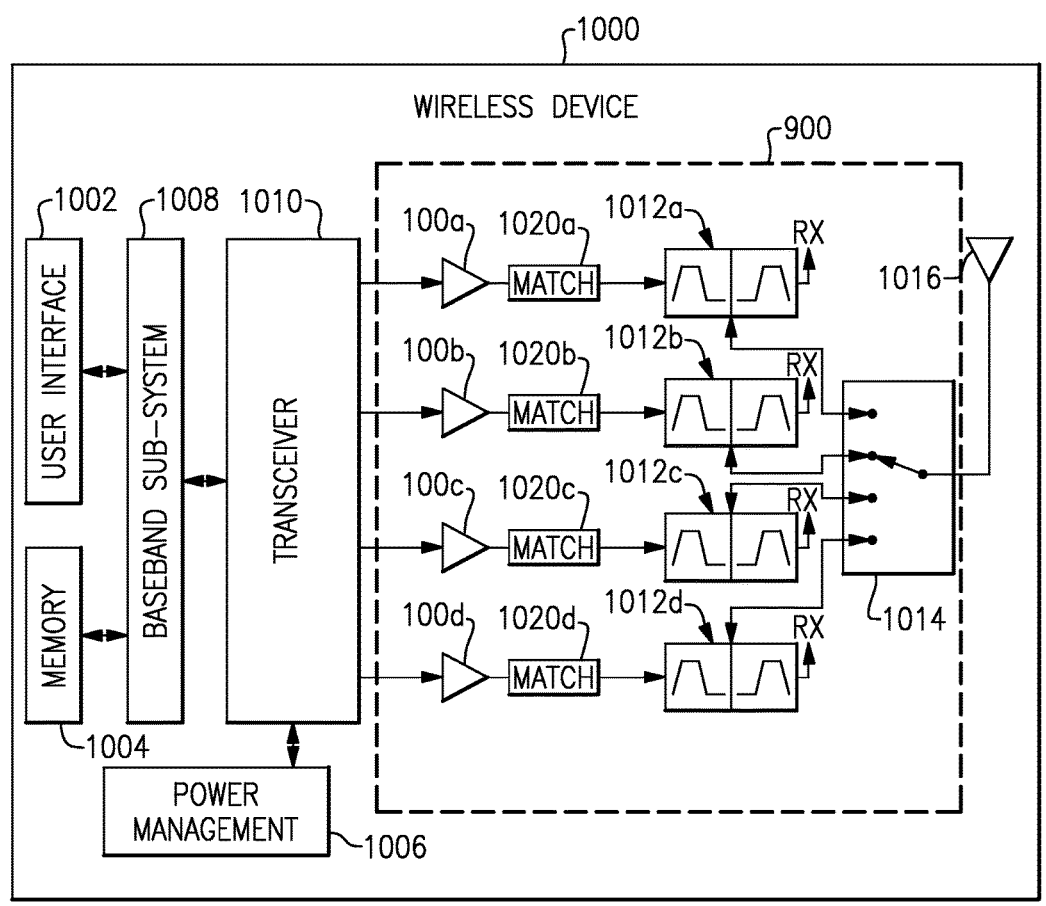
FIG. 10 depicts a wireless device having one or more features described herein.

FIG. 10 depicts an example wireless device 1000 having one or more advantageous features described herein. In the context of a module having one or more features as described herein, such a module can be generally depicted by a dashed box 900, and can be implemented as, for example, a front-end module (FEM).

Referring to FIG. 10, power amplifiers (PAs) 100a-100d can receive their respective RF signals from a transceiver 1010 that can be configured and operated in known manners to generate RF signals to be amplified and transmitted, and to process received signals. The transceiver 1010 is shown to interact with a baseband sub-system 1008 that is configured to provide conversion between data and/or voice signals suitable for a user and RF signals suitable for the transceiver 1010. The transceiver 1010 can also be in communication with a power management component 1006 that is configured to manage power for the operation of the wireless device 1000. Such power management can also control operations of the baseband sub-system 1008 and the module 900.

The baseband sub-system 1008 is shown to be connected to a user interface 1002 to facilitate various input and output of voice and/or data provided to and received from the user. The baseband sub-system 1008 can also be connected to a memory 1004 that is configured to store data and/or instructions to facilitate the operation of the wireless device, and/or to provide storage of information for the user.

In the example wireless device 1000, outputs of the PAs 100a-100d are shown to be matched (via respective match circuits 1020a-1020d) and routed to their respective diplexers 1012a-1012d. Such amplified and filtered signals can be routed to an antenna 1016 (or multiple antennas) through an antenna switch 1014 for transmission. In some embodiments, the diplexers 1012a-1012d can allow transmit and receive operations to be performed simultaneously using a common antenna (e.g., 1016). In FIG. 10, received signals are shown to be routed to "Rx" paths (not shown) that can include, for example, a low-noise amplifier (LNA).

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A signal combiner comprising:
   a balun transformer circuit having a first coil and a second coil, the first coil implemented between a first port and a second port, the second coil implemented between a third port and a fourth port, the first port and the third port coupled by a first capacitor, the second port and the fourth port coupled by a second capacitor, the first port configured to receive a first signal, the fourth port configured to receive a second signal, the second port configured to yield a combination of the first signal and the second signal; and
   a termination circuit that couples the third port to a ground, the termination circuit including a tunable impedance circuit and a harmonic rejection circuit configured to reduce the strength of one or more harmonics at the second port.

2. The signal combiner of claim 1 further comprising a controller configured receive a band select signal and to tune the tunable impedance circuit based on the band select signal.

3. The signal combiner of claim 2 wherein the controller is further configured to tune at least one of the first capacitor or the second capacitor.

4. The signal combiner of claim 1 wherein the first port is configured to receive a carrier-amplified signal from a Doherty power amplifier (PA) and the fourth port is configured to receive a peaking-amplified signal from the Doherty PA.

5. The signal combiner of claim 4 wherein the tunable impedance circuit includes a plurality of capacitors, each one of the plurality of capacitors having a capacitance approximately equal to a multiplicative inverse of two times pi times a respective operating frequency of the Doherty PA times a characteristic impedance of a load coupled to the Doherty PA.

6. The signal combiner of claim 4 further comprising a controller configured to receive a band select signal indicative of an operating frequency and to tune the tunable impedance circuit to have a capacitance approximately equal to a multiplicative inverse of two times pi times the operating frequency times a characteristic impedance of a load coupled to the Doherty PA.

7. The signal combiner of claim 6 wherein the controller is further configured to tune the first capacitor and the second capacitor to have a capacitance approximately equal to half the capacitance of the tunable impedance circuit.

8. The signal combiner of claim 1 wherein the first port is configured to receive a peaking-amplified signal from a Doherty power amplifier (PA) and the fourth port is configured to receive a carrier-amplified signal from the Doherty PA.

9. The signal combiner of claim 8 wherein the tunable impedance circuit includes a plurality of inductors, each one of the plurality of inductors having an inductance approximately equal to a characteristic impedance of a load coupled to the Doherty PA divided by two times pi times a respective operating frequency of the Doherty PA.

10. The signal combiner of claim 8 further comprising a controller configured to receive a band select signal indicative of an operating frequency and to tune the tunable impedance circuit to have an inductance approximately equal to a characteristic impedance of a load coupled to the Doherty PA divided by two times pi times the operating frequency.

11. The signal combiner of claim 1 wherein the tunable impedance matching circuit includes a plurality of impedance elements connected in parallel, each one of the plurality of impedance elements including an impedance and a switch connected in series.

12. The signal combiner of claim 1 wherein the harmonic rejection circuit includes a plurality of resonant elements connected in series, each one of the plurality of resonant elements including an inductor and a capacitor connected in parallel.

13. The signal combiner of claim 12 wherein each one of the plurality of resonant elements has a resonant frequency approximately equal to a multiple of an operating frequency of the signal combiner.

14. The signal combiner of claim 13 wherein each one of the plurality of resonant elements has a resonant frequency approximately equal to twice a respective operating frequency of the signal combiner.

15. The signal combiner of claim 1 wherein the harmonic rejection circuit is implemented between the third port and the tunable impedance circuit.

16. A power amplifier (PA) module comprising: a packaging substrate configured to receive a plurality of components; and a signal combiner implemented on the packaging substrate, the signal combiner including a balun transformer circuit having a first coil and a second con, the first coil implemented between a first port and a second port, the second coil implemented between a third port and a fourth port, the first port and the third port coupled by a first capacitor, the second port and the fourth port coupled by a second capacitor, the first port configured to receive a first signal, the fourth port configured to receive a second signal, the second port configured to yield a combination of the first signal and the second signal, the signal combiner further including a termination circuit that couples the third port to a ground, the termination circuit including a tunable impedance circuit and a harmonic rejection circuit configured to reduce the strength of one or more harmonics at the second port.

17. The PA module of claim 16 further comprising a controller implemented on the packaging substrate, the controller configured to receive a band select signal and tune the tunable impedance circuit based on the band select signal.

18. A wireless device comprising:
a transceiver configured to generate a radio-frequency (RF) signal;
a power amplifier (PA) module in communication with the transceiver, the PA module including an input circuit configured to receive the RF signal and split the RF signal into a first portion and a second portion, the PA module further including a Doherty PA having a carrier amplification path coupled to the input circuit to receive the first portion and a peaking amplification path coupled to the input circuit to receive the second portion, the PA module further including an output circuit coupled to the Doherty amplifier circuit, the output circuit including a balun transformer circuit having a first coil and a second coil, the first coil implemented between a first port and a second port, the second coil implemented between a third port and a fourth port, the first port and the third port coupled by a first capacitor, the second port and the fourth port coupled by a second capacitor, the first port configured to receive a first signal via the carrier amplification path, the fourth port configured to receive a second signal via the peaking amplification path, the second port configured to yield a combination of the first signal and the second signal as an amplified RF signal, the PA module further including a termination circuit that couples the third port to a ground, the termination circuit including a tunable impedance circuit and a harmonic rejection circuit configured to reduce the strength of one or more harmonics at the second port; and
an antenna in communication with the PA module, the antenna configured to facilitate transmission of the amplified RF signal.

19. The wireless device of claim 18 further comprising a controller configured to receive a band select signal and to tune the tunable impedance circuit based on the band select signal.

* * * * *